United States Patent [19]

Mateika et al.

[11] 4,429,052
[45] Jan. 31, 1984

[54] MAGNETIC HEXAGONAL FERRITE LAYER ON A NONMAGNETIC HEXAGONAL MIXED CRYSTAL SUBSTRATE

[75] Inventors: Dieter W. Mateika, Ellerbek; Ernst-Günter Bartels, Pinneberg, both of Fed. Rep. of Germany

[73] Assignee: U.S. Philips Corporation, New York, N.Y.

[21] Appl. No.: 395,160

[22] Filed: Jul. 6, 1982

Related U.S. Application Data

[62] Division of Ser. No. 219,030, Dec. 22, 1980, Pat. No. 4,355,072.

[30] Foreign Application Priority Data

Feb. 12, 1980 [DE] Fed. Rep. of Germany ....... 3005195
Feb. 12, 1980 [DE] Fed. Rep. of Germany ....... 3005219

[51] Int. Cl.$^3$ .................... C04B 35/46; C04B 35/48; C01F 11/02; C01G 15/00
[52] U.S. Cl. .................................. 501/135; 423/593; 423/594; 423/596; 423/598; 423/599; 501/136; 501/137; 501/138
[58] Field of Search ............... 501/135, 136, 137, 138; 423/593, 594, 596, 598, 599; 252/62.57

[56] References Cited

U.S. PATENT DOCUMENTS

4,323,618 4/1982 Damen et al. ...................... 423/593
4,379,853 4/1983 Mateika et al. .................. 252/62.57

OTHER PUBLICATIONS

Mat. Res. Bull. vol. 10, pp. 1255-1258 (1975).
Russian Journal of Inorganic Chemistry, vol. 21, (6), 1976 pp. 903-904, Journal of App. Phys. vol. 49, No. 3, pp. 1578-1580 (1978).
Russian Journal of Inorganic Chemistry, vol. 20, (7) 1975 pp. 1098-1100.
Journal of Crystal Growth, vol. 17, pp. 302-211 (1972) by S. L. Blank, J. W. Nielsen.
"Berichte den Deutschen Keramische Gesellschaft" vol. 54, No. 11, pp. 373-378 (1977).
Proc-IEEE, vol. 63, No. 8, pp. 1176-1195 (1975) A. H. Bobeck et al.

*Primary Examiner*—Mark Bell
*Attorney, Agent, or Firm*—Marc D. Schechter

[57] ABSTRACT

With the fabrication of a substrate material in the form of alkaline-earth gallate single crystals it has become possible to grow monocrystalline barium hexaferrite layers of high quality. These thin barium hexaferrite layers on the alkaline-earth gallate substrates are extremely suited as magnetic devices because of their very high uniaxial anisotropy and their small line width. Such magnetic devices can be used for passive microwave components, e.g. as resonance isolators or filters in the centimeter wavelength range or as components in information storage technology, e.g. in magnetic cylindrical domain devices, especially in the field of very small (submicron) cylindrical domains.

5 Claims, 1 Drawing Figure

U.S. Patent  Jan. 31, 1984  4,429,052
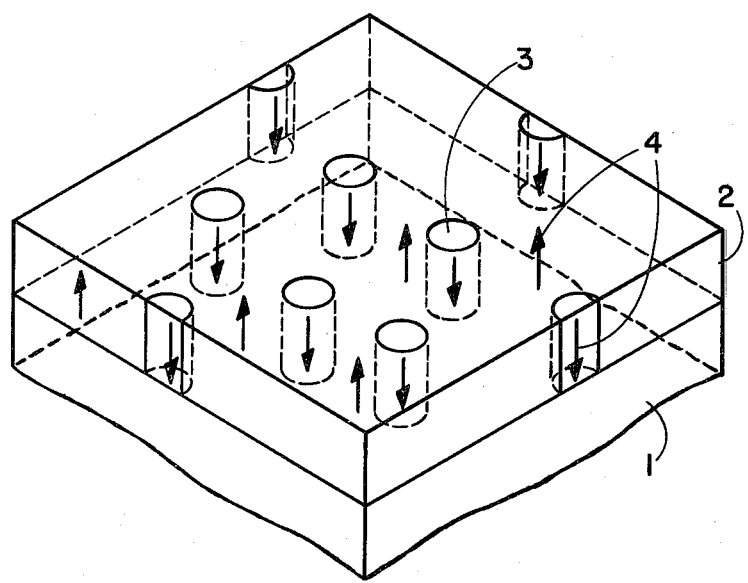

MAGNETIC HEXAGONAL FERRITE LAYER ON A NONMAGNETIC HEXAGONAL MIXED CRYSTAL SUBSTRATE

This is a division of application Ser. No. 219,030, filed Dec. 22, 1980, now U.S. Pat. No. 4,355,072.

BACKGROUND OF THE INVENTION

The invention relates to a magnetic device having a monocrystalline, nonmagnetic substrate. The substrate has a surface on which a layer of a monocrystalline, magnetic hexagonal ferrite materials is deposited.

Because of their very great uniaxial anisotropies and their small line widths, hexagonal, monocrystalline, thin ferrite layers (e.g. barium hexaferrite with the simple formula $BaO \cdot 6Fe_2O_3$) on nonmagnetic substrates could have exceptional importance. These ferrite layers could, for example, be important as passive microwave components (e.g. as resonance isolators or filters in the centimeter wavelength range), or as components in information storage technology (e.g. in magnetic cylindrical domain devices especially in the field of submicron cylindrical domains). As is already known, magnetic garnet layers, which are used in information storage technology for example, cannot be used at frequencies higher than 50 GHz.

In order to fabricate hexagonal monocrystalline ferrite layers of a quality, homogeneity and crystal perfection as has been achieved, for example, in similar components made with magnetic garnet layers, a monocrystalline substrate is necessary. The substrate must not only have a similar chemical composition as compared to that of the layer grown on it, but it must also have a similar crystallographic structure and an almost identical lattice constant as compared to the layer to be deposited thereon.

Attempts have been made to grow hexagonal monocrystalline ferrite layers, for example with the composition $Ba_2Zn_2Fe_{12}O_{22}$, on hexagonal ferrite substrates with the composition $BaFe_{12}O_{19}$ by means of liquid phase epitaxy (Mat. Res. Bull. 10 (1975) pp. 1255–1258.) Satisfactory results were not obtained with these substrates according to reports of the work (viz. page 1255, final paragraph, to page 1256, first paragraph).

Attempts were also made to grow hexagonal monocrystalline ferrite layers, for example with the composition $BaO \cdot 6Fe_2O_3$, on nonmagnetic spinel substrates with the composition $ZnGa_2O_4$ or $Mg(In,Ga)_2O_4$ by means of epitaxy. These attempts were also unsuccessful; the layers did not grow flawlessly but formed islands on the substrate surfaces to be coated (Cf. J. Appl. Phys. 49 (1978) No. 3, pp. 1578–1580.)

For all magnetic applications of the described ferrite layers, the substrate must be nonmagnetic since magnetic substrates adversely affect the magnetic properties of the components to be made with them. Until recently it was not possible to produce monocrystalline hexagonal ferrite layers of good quality, homogeneity and crystal perfection because no suitable substrate was available for seeding.

SUMMARY OF THE INVENTION

An object of the invention is to create a magnetic device having a magnetic monocrystalline, hexagonal ferrite layer on a monocrystalline nonmagnetic substrate in which the quality and crystal perfection of the thin magnetic layer are at such a level that they correspond to the quality of magnetic garnet layers.

According to the invention, this object is achieved by providing the magnetic ferrite layer on a substrate consisting of an alkaline-earth gallate mixed crystal with the general formula $$A_{1+y}^{2+}Ga_{12-2x-y}B_x^{2+}C_x^{4+}O_{19}.$$

In this formula the symbols are defined as follows:
A = barium and/or strontium,
B = one or more of magnesium, manganese, zinc, iron, copper, nickel, cobalt, and chromium,
C = one or more of zirconium, hafnium, titanium, and tin, and $0.1 = x - 1.2$ and $0 - y = 0.8$.

According to an advantageous embodiment of the invention, the surface of the substrate on which the magnetic layer is to be deposited is oriented substantially in the [001]; direction however it has a deviation from the direction of the c-axis in the range of 1° to 2°.

It was found that the qualitatively best layers grow on a substrate surface having a deviation from the direction of the c-axis of this order of magnitude. At a greater deviation from the direction of the c-axis (5° to 10°), a step-like growth of the monocrystalline layer takes place on the substrate. Moreover, when the substrate surface is oriented exactly along the c-axis, an island-like growth results.

According to a further advantageous embodiment of the invention, the thickness of the monocrystalline, magnetic layer lies in the range of 0.5 to 10 μm. It is important that the layer thickness is not greater than 10 μm because a flaking of the layer is observed with greater layer thickness. This is possibly attributable to the easy cleavability of the magnetic material perpendicular to the direction of the c-axis.

A method of manufacturing a magnetic device according to the invention is advantageously carried out by first dry-pressing the starting substances for the monocrystalline substrate and then sintering them at 1500° C. for 12 to 30 hours in an oxygen atmosphere. Next, the sintered compact is melted in a closed crystal pulling apparatus at approximately 1600° C. in order to produce a monocrystalline substrate according to the Czochralski process. Subsequently, a single crystal is pulled from this melt with the aid of a seed crystal. The growth rate is 1 to 2 mmh$^{-1}$ and the seed crystal rotation rate is 5 to 20 r.p.m. The single crystal so produced is then cut and polished to form segments with a thicknesses of 0.5 to 1 mm with an orientation substantially in the 001 direction but with a deviation of 1° to 2° from the direction of the c-axis. Finally a magnetic monocrystalline layer of hexagonal hexaferrite material is epitaxially deposited on at least one of the substrate layer surfaces.

According to a further embodiment of the invention, a mixture of 77.87 grams SrO, 481.97 grams $Ga_2O_3$, 9.90 grams MgO and 30.26 grams $ZrO_2$ is melted to form the starting material for the melt. From the melt, the monocrystalline substrate is pulled, by the Czochralski process, a $CO_2$ atmosphere. The substrate so formed has the composition $$Sr_{1.03}Ga_{10.99}Mg_{0.49}Zr_{0.49}O_{18.99}.$$

According to a further embodiment of the invention, a mixture of 19.28 grams $SrCO_3$, 112.39 grams $Ga_2O_3$, 9.79 grams ZnO and 14.8 grams $ZrO_2$ is melted to form the starting material for the melt. From this melt, the monocrystalline substrate is pulled, by the Czochralski process, in an atmosphere having an oxygen pressure of 1 bar and a nitrogen pressure of 5 bar. The resulting substrate has the composition $$Sr_{1.0}Ga_{10.38}Zn_{0.81}Zr_{0.81}O_{19}.$$

Advantageously, the magnetic layer is produced on the nonmagnetic substrate by liquid phase epitaxy.

The advantages of the invention all principally in creating a substrate material on which it is now possible to produce flawless monocrystalline layers of magnetic hexagonal hexaferrites (e.g. barium hexaferrite) of good quality, homogeneity and crystal perfection. A further advantage of the process according to the invention is that single crystals can be grown large enough for industrial use.

Difficulties are attached to the growth of alkaline-earth gallate single crystals. The T-x phase diagrams of the $BaO/Ga_2O_3$ and $SrO/Ga_2O_3$ systems are known (P. Batti, G. Sloccari Ann. Chim. 59 (1969) pp. 155-162; L. M. Korba et al., Russian J. of Inorganic Chemistry 20 (1975) 7; V. P. Kobzareva et al., Russian J. of Inorganic Chemistry 21 (1976) 6.) According to these studies, the compounds $BaGa_{12}O_{19}$ and $SrGa_{12}O_{19}$ melt incongruently. As the first phase, $Ga_2O_3$ crystallizes from stoichiometric melts. Growth from its own melt is therefore not possible. Moreover, according to the phase diagram the existence region of both compounds is very narrow. Thus, for example, strontium gallate crystallizes from melts in the concentration range of approximately 32 mole %. SrO and 68 mole % $Ga_2O_3$ to 36 mole % SrO and 64 mole % $Ga_2O_3$. The crystal has a molar ratio of 14 mole % SrO and 86 mole % $Ga_2O_3$. For this reason, growth of the single crystal along the liquidus curve from nonstoichiometric melts is likewise ruled out; this has been confirmed by experiments. For monocrystalline growth of alkaline-earth gallates, like $SrGa_{12}O_{19}$ for example, the narrow existence region and the large surplus of SrO (18 mole %) or the deficit of $Ga_2O_3$ in the melt are the decisive obstacles in growing the crystallizing compound.

Surprisingly, it was found that a hexagonal alkaline-earth gallate phase can be produced from the melt if the gallium ions of the hexagonal compound are partially replaced by other ions, especially bivalent and tetravalent ions. Moreover, this substitution of the gallium ions is also important for the matching of the lattice constant of the substrate to that of the magnetic layer.

It will be shown by means of four examples how the surplus of SrO in the melt can be removed by substitution of the gallium ions. The crystal compositions 1 to 4 shown below result from the melt compositions 1 to 4, also shown below:

Melt composition
1. $Sr_{2.48}Ga_{10.52}O_{18.26}$
2. $Sr_{1.53}Ga_{10.47}Mg_{0.5}Zr_{0.5}O_{18.75}$
3. $Sr_{1.085}Ga_{9.915}MnZrO_{18.96}$
4. $Sr_{1.085}Ga_{9.915}ZnZrO_{18.96}$ Crystal composition
1. $SrGa_{12}O_{19}$
2. $Sr_{1.03}Ga_{10.99}Mg_{0.49}Zr_{0.49}O_{.18.99}$
3. $Sr_{1.0}Ga_{10.6}Mn_{0.7}Zr_{0.7}O_{19}$
4. $Sr_{1.0}Ga_{10.38}Zn_{0.81}Zr_{0.81}O_{19}$ The surplus of SrO of 1.48 per formula unit in non-substituted melts (composition 1) can be removed by the coupled substitution of the gallium ions up to 0.085 per formula unit (composition 4). The monocrystalline growth of alkaline-earth gallate mixed crystals from the melt is only possible as a result of this.

BRIEF DESCRIPTION OF THE DRAWING

The drawing FIGURE shows a magnetic device according to the invention in the form of a cylindrical domain device, shown in perspective from above.

DESCRIPTION OF THE PREFERRED EMBODIMENTS

A monocrystalline, hexagonal, magnetic, 10 μm thick hexaferrite layer 2 was grown by epitaxy on a nonmagnetic hexagonal 0.5 mm thick substrate 1 from an alkaline-earth gallate single crystal domains 3 were produced in layer 2 by applying a magnetic field of approximately 20 kOe perpendicular to the layer. The magnetisation of the layer is shown by arrows 4.

Example of embodiment I

As an example of the fabrication of a nonmagnetic hexagonal, monocrystalline substrate which is suitable for the growth of monocrystalline, hexagonal, hexaferrite layers for the fabrication of a magnetic device (FIG. 1), the growth of a strontium gallate single crystal with the composition of $Sr_{1.03}Ga_{10.99}Mg_{0.49}Zr_{0.49}O_{18.99}$ is described. As starting substances for the melt, 77.87 grams SrO, 481.97 grams $Ga_2O_3$, 9.90 grams MgO and 30.26 grams $ZrO_2$ were mixed, pressed into cylindrical form, and sintered in an oxygen atmosphere at a temperature of 1500° C. The sintered compact was then melted in an inductively heated crucible made of iridium at a temperature of 1600° C. in a closed crystal-pulling apparatus as known for the implementation of the Czochralski process. The mixture was melted in a carbon dioxide atmosphere (flow rate 500 l/h).

A cylindrical monocrystalline bar with the same chemical composition as that of the single crystal to be fabricated was used as a seed crystal. The pulling process was implemeted in a known way according to the Czochralski process. The growth rate was 1 mm h$^{-1}$, the seed crystal was rotated at a speed of 8 r.p.m. After this process, single crystals of $Sr_{1.03}Ga_{10.99}Mg_{0.49}Zr_{0.49}O_{18.99}$ with a length of 65 mm and a diameter of 30 mm were fabricated. The lattice constants were $a_o=0.582$ nm and $c_o=2.307$ nm (a and c=crystallographic directions in the hexagonal lattice). In comparison the lattice constants of $BaFe_{12}O_{19}$ are $a_o=0.589$ nm and $c_o=2.320$ nm.

Example of embodiment II

The growth of a single crystal of $Sr_{1.0}Ga_{10.38}Zn_{0.81}Zr_{0.81}O_{19}$ is described below.

The following starting substances were mixed, pressed into a cylindrical form and sintered at 1500° C. in an oxygen atmosphere:
 $SrCO_3$: 19.28 grams
 $Ga_2O_3$: 112.39 grams
 ZnO: 9.79 grams
 $ZrO_2$: 14.84 grams The sintered compact was then melted in an inductively heated crucible of platinum or iridium at a temperature of 1600° C. in a closed crystal pulling apparatus as used for the implementation of the Czochralski process. The pressures of the sintering atmosphere in the apparatus were 1 bar of oxygen and 5 bar of nitrogen.

A cylindrical single crystalline bar of the same chemical composition as that of the single crystal to be grown was used as a seed crystal. The pulling process was implemented in a known way according to the Czochralski process. The growth rate was 2 nm h$^{-1}$ and the speed of rotation of the seed crystal was 20 r.p.m. Crystals with a length of 23.5 mm and a diameter of 10 mm were grown. The lattice constants were $a_o = 0.583$ nm and $c_o = 2.324$ nm.

All crystals grown, both according to the example of embodiment I and the example of embodiment II, were colorless and optically transparent. The crystal perfection was examined with a polarization microscope and by means of the Schlieren method. Displacements and occlusions were established to be $<1.10^2/cm^2$.

These examples describe the growth of single crystals of strontium gallate in which part of the gallium ions are replaced by magnesium and zirconium ions or by zinc and zirconium ions. However, because of very similar ionic radii, manganese or iron or copper or nickel or cobalt or chromium can be used instead of magnesium or zinc, and hafnium or titanium or tin can be used instead of zirconium.

In order to use the above-grown crystals in a magnetic device for use as a microwave component or as a magnetic cylindrical domain device, the crystals are cut to form substrate slices substantially oriented in the [001] direction and having a thickness of 0.5 mm to 1 mm. (The deviation from the [001] orientation is of the order of 1° to 2°). The substrate slices are then polished. A magnetic, hexagonal, monocrystalline hexaferrite layer with a thickness of up to 10 μm, preferably a barium hexaferrite layer, is applied to these substrate slices preferably by means of liquid phase epitaxy (LPE). However, growth from the vapor phase (CVD) can also be considered for the application of the layer.

The growth process is essentially the same as the LPE process described by S. L. Blank and J. W. Nielsen in J. of Cryst. Growth 17 (1972), pp. 302-311, but there is a considerably higher concentration of ferrite material to be crystallized out.

The melt from which the ferrite layers are grown has the following composition (in weight percent).

| | |
|---|---|
| PbO | 76.99 |
| B$_2$O$_3$ | 1.91 |
| BaO | 2.71 |
| Fe$_2$O$_3$ | 16.90 |
| Ga$_2$O$_3$ | 0.99 |
| Al$_2$O$_3$ | 0.50 |
| | 100.00 |

The starting substances are melted in a platinum crucible at 1100° C. and stirred for several hours with a platinum stirrer in order to homogenize the melted solution. The saturation temperature of the given composition is approximately 905° C. The melt is cooled to 975° C. and the temperature is held constant; this is an isothermal growth process. The substrate, attached to a platinum holder, is dipped in the melt in a known way in a vertical or horizontal position with or without rotational movement according to the growth conditions. An approximately 4 μm thick layer crystallized out of the melt in 90 seconds where the substrate was oriented vertically without rotation.

Chemical analysis, lattice constant analysis and measurement of the anisotropy field of the layer at 60-90 GHz revealed that it was barium hexaferrite with magnetoplumbite structure Ba(Pb)Fe$_{12}$O$_{19}$. The chemical analysis of the layer was conducted with a microprobe and revealed a lead content of approximately 6 weight % PbO, determined by the melt composition and the growth parameters. The saturation magnetization ($4\pi M_s$) of the layer material was determined at 4000 Gauss. The difference in lattice constants between the layer and the substrate, the lattice mismatch, was determined by X-ray measurements at 0028 reflex. By someone killed in the art, the lattice constant of the layer can be matched to that of the substrate using weighted additions of gallium or aluminium. In the case of barium hexaferrite Ba(Pb)Fe$_{12}$O$_{19}$ the mismatch is around $-0.013$ nm, which is reduced to $-0.007$ nm by incorporation of gallium or aluminium ions.

Magnetic domain structures (FIG. 1) were observed in the layer produced by the process described above. In this connection, however, the following points should be noted.

The polarization effect is extinguished by the double refraction of the substrates, i.e. the Weiss domains otherwise visible due to Faraday rotation are not visible. However, domains can be recognized easily in deposited layers in which the double refraction of the substrate cannot remove the Faraday rotation and the polarization effect. By applying a magnetic field of approximately 20 kOe at right angles to the layer cylindrical domains were produced (and photographed) from strip domains present in this layer. The size, that is the diameter of the cylindrical domains depends on the thickness of the magnetic layer; cylindrical domains are smaller than 1 μm in diameter if the layer thickness is reduced to under 1 μm, but they can no longer be made visible in the light microscope since the wavelength of the light forms a limit here. This phenomenon was described in the work of F. Haberey, G. Oehlschlegel, and K. Sahl in "Berichte der Deutschen Keramischen Gesellschaft" 54 (1977), No. 11, pp. 373-378.

Components for cylindrical domain applications, made as described above with substrate provided with a monocrystalline barium hexaferrite layer, can be fabricated with known techniques as described, for example, by A. H. Bobeck, P. I. Bonyhard, J. E. Geusic in Proc. I.E.E.E. 63 (1975), No. 8, pp. 1176-1195.

What is claimed is:

1. A crystalline material consisting essentially of a hexagonal alkaline-earth gallate mixed crystal with a formula $$A_{1+y}^{2+}Ga_{12-2x-y}B_x^{2+}C_x^{4+}O_{19},$$

where A is one or more elements selected from the group consisting of barium and strontium, B is one or more elements selected from the group consisting of magnesium, manganese, zinc, iron, copper, nickel, cobalt, and chromium, C is one or more elements selected from the group consisting of zirconium, hafnium, titanium, and tin, and

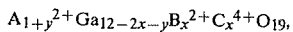

2. A crystalline material as claimed in claim 1, CHARACTERIZED IN THAT the crystal is a single crystal.

3. A crystalline material as claimed in claim 2, CHARACTERIZED IN THAT $0.4 \leq x \leq 0.8$.

4. A crystalline material as claimed in claim 3, CHARACTERIZED IN THAT the crystal has the formula $$Sr_{1.03}Ga_{10.99}Mg_{0.49}Zr_{0.49}O_{18.99}.$$

5. A crystalline material as claimed in claim 3, CHARACTERIZED IN THAT the crystal has the formula $$Sr_{1.0}Ga_{10.38}Zn_{0.81}Zr_{0.81}O_{19}.$$

* * * * *